(12) United States Patent
Reighard et al.

(10) Patent No.: US 6,457,655 B1
(45) Date of Patent: Oct. 1, 2002

(54) METHOD AND APPARATUS FOR MEASURING AND ADJUSTING A LIQUID SPRAY PATTERN

(75) Inventors: Michael A. Reighard, Avon Lake, OH (US); Jeffrey Minnich, Elyra, OH (US); John P. Byers, Avon Lake, OH (US); Jacques Mycke, Maastricht (NL); Mark van der Heijden, Maastricht (NL)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/654,404

(22) Filed: Sep. 1, 2000

Related U.S. Application Data
(60) Provisional application No. 60/152,413, filed on Sep. 3, 1999.

(51) Int. Cl.[7] ................................................. A62C 5/02
(52) U.S. Cl. .............................. 239/8; 239/69; 239/73; 239/101
(58) Field of Search ............................... 239/8, 1, 101, 239/70, 67–69, 73; 427/8

(56) References Cited

U.S. PATENT DOCUMENTS

| | | | |
|---|---|---|---|
| 4,346,849 | A | 8/1982 | Rood |
| 4,349,947 | A | 9/1982 | Rood |
| 5,017,409 | A | 5/1991 | Bok |
| 5,208,064 | A | 5/1993 | Becker et al. |
| 5,322,706 | A | 6/1994 | Merkel et al. |
| 5,380,366 | A | 1/1995 | Becker et al. |
| 5,409,733 | A | 4/1995 | Boger et al. |

*Primary Examiner*—Lisa A. Douglas
(74) *Attorney, Agent, or Firm*—Wood, Herron & Evans, L.L.P.

(57) ABSTRACT

A control system for use in a liquid dispensing system to measure and adjust a liquid spray pattern dispensed from the liquid dispensing system. The control system includes a sensor that detect edges of the liquid spray pattern and, from the detected positions of those edges, is operable to adjust the liquid spray pattern to a pattern width set by the operator. The control system is also operable to measure the width of the liquid spray pattern and the offset of the liquid spray pattern relative to a nozzle centerline of the liquid dispensing system and provide warnings to the operator if those measurements fall outside of acceptable ranges.

21 Claims, 7 Drawing Sheets

METHOD AND APPARATUS FOR MEASURING AND ADJUSTING A LIQUID SPRAY PATTERN

The present application claims the filing benefit of U.S. provisional application Serial No. 60/152,413, filed Sep. 3, 1999, the disclosure of which is hereby incorporated herein by reference in its entirety.

FIELD OF THE INVENTION

The present invention relates generally to control systems for liquid dispensers and, more particularly, to a control system and method for controlling the dispensed liquid spray pattern of a liquid dispensing system.

BACKGROUND OF THE INVENTION

Various liquid dispensing systems have been developed to dispense a liquid spray pattern from a nozzle outlet toward a surface of a substrate. For example, in conformal coating applications, liquid dispensing systems have been designed to dispense flat, fan-like liquid spray patterns of conformal coating material onto a surface of the substrate, such as a printed circuit board. The dispensing nozzle of these systems may be a cross-cut, slit or air-assisted slot nozzle, for example, that is configured to dispense the coating material as a spray, continuous band or sheet, or fibrous web of a predetermined pattern width toward the circuit board. The dispensing nozzle is typically moved by a robotic movement platform in opposite back-and-forth directions relative to the circuit board to dispense side-by-side tracks or bands of conformal coating onto the circuit board and thereby obtain a uniform moisture resistant barrier on the board surface. Alternatively, the circuit board may be moved relative to the liquid dispenser which may be fixed.

During the conformal coating process, it is important that the tracks or bands of coating join or converge along their adjacent edges, or even slightly overlap, to ensure that a full surface coating is provided on the board. Otherwise, the circuit board will be left vulnerable to undesirable chemical or moisture attack by any gaps left between the coating tracks or bands. On the other hand, too much overlap of the adjacent edges may cause undesirable bubbles in the thickened coating areas at the overlap that may also jeopardize quality control. Thus, a consistent width of the liquid spray pattern is generally necessary to obtain a uniform layer of conformal coating on circuit boards.

Unfortunately, while a liquid material dispenser may adequately and reliably dispense uniform conformal coating layers on circuit boards in one production run, changes in the viscosity and/or fluid pressure of the material will often lead to undesirable variations in the liquid spray pattern width. Additionally, contamination or partial blockage of the nozzle outlet will cause the spray pattern to become offset relative to a centerline of the nozzle. When this occurs, one edge of the liquid spray pattern is spaced from the nozzle outlet centerline a greater distance than the other edge. If these changes are not detected prior to a production run, improperly coated boards must be reworked and costly downtime of the conformal coating system is typically required to identify the problem and manually adjust the liquid dispensing system to obtain the desired pattern width and minimal offset. As those skilled in the art will readily appreciate, pattern width control is also critical in other liquid dispensing applications as well, such as in paint, flux and hot melt adhesive dispensing environments. In each of these applications, very often the edge positions of the dispensed liquid pattern relative to a substrate surface or to an adjacent liquid pattern dispensed on the substrate must be properly adjusted and set to obtain the desired material application.

Thus, there is a need for a control system for use in a liquid dispensing system that improves width control of the dispensed liquid spray pattern.

There is also a need for a control system for use in a liquid dispensing system that improves the operator's ability to readily identify problems in the dispensed liquid spray pattern.

There is yet also a need for a control system for use in a liquid dispensing system that improves the operator's ability to adjust the width of the liquid spray pattern to accommodate for variations in liquid material viscosities and pressures.

SUMMARY OF THE INVENTION

The present invention overcomes the foregoing and other shortcomings and drawbacks of liquid dispenser control systems and methods heretofore known. While the invention will be described in connection with certain embodiments, it will be understood that the invention is not limited to these embodiments. On the contrary, the invention includes all alternatives, modifications and equivalents as may be included within the spirit and scope of the present invention.

The control system of the present invention is operable to measure and adjust the liquid spray pattern dispensed from a liquid dispensing system. In one embodiment of the present invention the control system includes a sensor fixture located in the vicinity of the liquid dispensing system, and an interface unit that is electrically and fluidly connected to the sensor fixture. The interface unit is also fluidly connected to the liquid dispensing system and a source of supply air, and further electrically coupled to a robot controller of an X-Y-Z robot movement platform associated with the liquid dispensing system.

The sensor fixture includes a drain pan or receptacle for receiving and draining liquid material that is dispensed from the liquid dispensing system during a pattern measurement and adjustment procedure. The drain pan is fluidly connected to a fluid reservoir that is connected to main system vent air. A pair of fiber optic sensors are mounted in confronting relationship on opposite sides of the drain pan. Each of the sensors is mounted in a sensor shroud that is releasably engageable with the drain pan through one of a pair of upstanding resilient fingers or clips formed on opposite side walls of the drain pan. The sensor shrouds each receive regulated supply air from the interface unit so that air flows toward the dispensed liquid spray pattern to keep the sensors free from contamination during the measurement and adjustment procedure.

The interface unit of the control system includes a voltage/pressure regulator that is operable to provide a regulated output air pressure to a pneumatically controlled fluid regulator associated with the liquid dispensing system. The regulated output air pressure supplied by the voltage/pressure regulator is controlled by a pressure controller of the interface unit. The pressure controller is operable to receive signals from the robot controller to increase or decrease the regulated output air pressure supplied from the voltage/pressure regulator to the pneumatically controlled fluid regulator of the liquid dispensing system. The robot controller is operable to receive signals from a fiber optic amplifier of the interface unit that is electrically coupled to the pair of fiber optic sensors. The width of the liquid spray pattern dispensed from a nozzle of the liquid dispensing system may be readily varied by varying the output air pressure supplied from the voltage/pressure regulator to the pneumatically controlled regulator of the liquid dispensing system.

During a liquid spray pattern measurement or adjustment procedure, the sensors of the sensor fixture are operable to detect the presence or absence of an edge of the dispensed liquid spray pattern. In accordance with one aspect of the present invention, the nozzle of the liquid dispensing system is moved to a predetermined position relative to the sensors. The pattern width of the liquid spray pattern is automatically adjusted to the pattern width set by the operator by increasing or decreasing the width of the dispensed spray pattern until the presence or absence of an edge of the spray pattern is detected by the sensors.

In accordance with another aspect of the present invention, the nozzle is moved relative to the sensors until the opposite edges of the spray pattern are detected by the sensors. The positional location of each edge is recorded at the location of detection by the sensors. The control system is operable to measure the width of the dispensed spray pattern from the positional locations of the detected opposite edges of the spray pattern. If the measured pattern width falls outside of an acceptable range, a warning is provided to the operator. The control system is also operable to measure the offset of the spray pattern relative to a centerline of the nozzle from the positional locations of the detected edges of the spray pattern. If the measured offset falls outside of an acceptable range, a warning is also provided to the operator.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENT

Figures 1, 3:
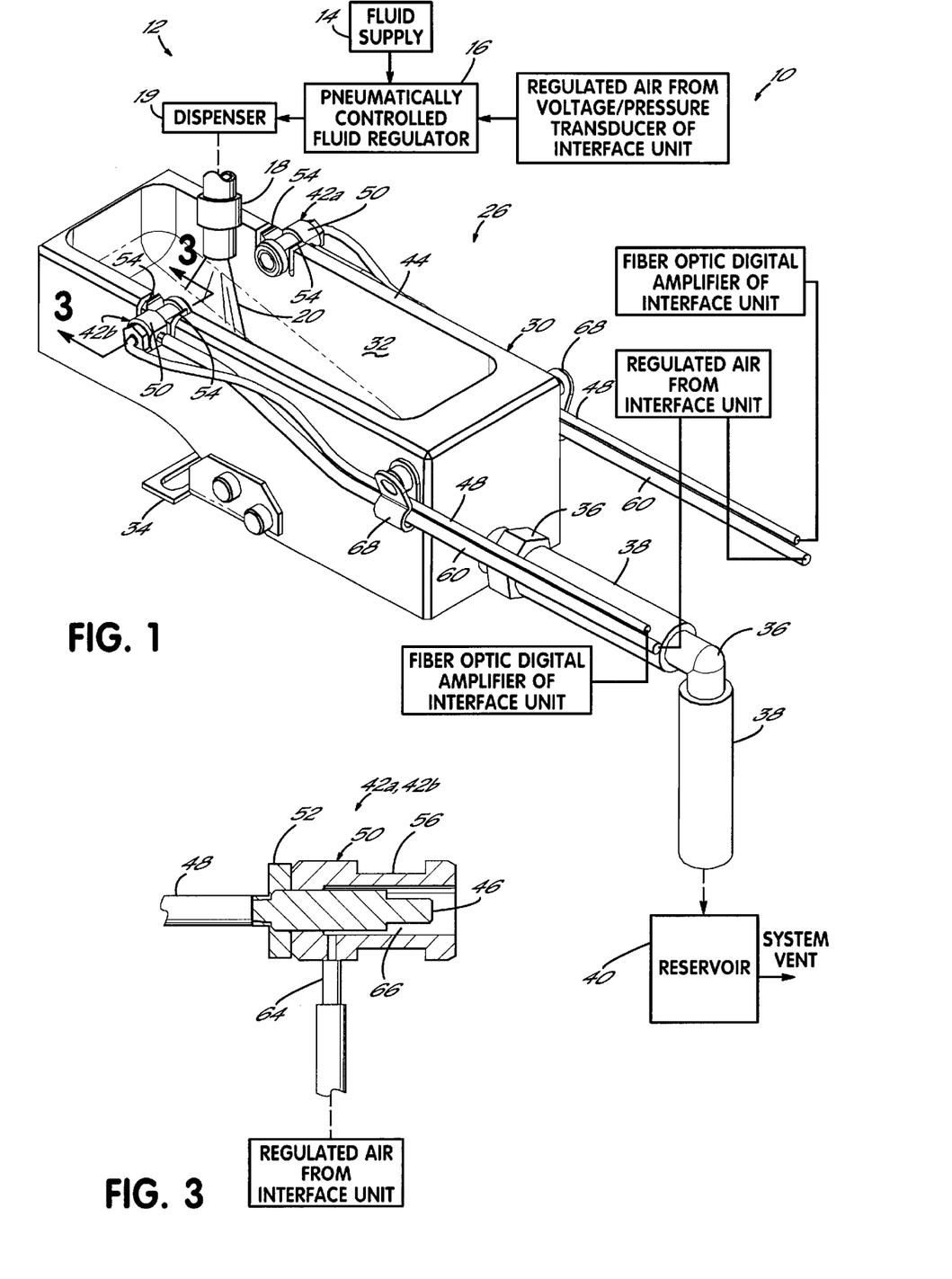
FIG. 1 is a partial diagrammatic view of a liquid spray control system in accordance with the principles of the present invention for use in a liquid dispensing system that dispenses a liquid spray pattern toward a substrate.
FIG. 3 is a cross-sectional view of a sensor and sensor shroud taken along line 3—3 of FIG. 1.
Figure 2:
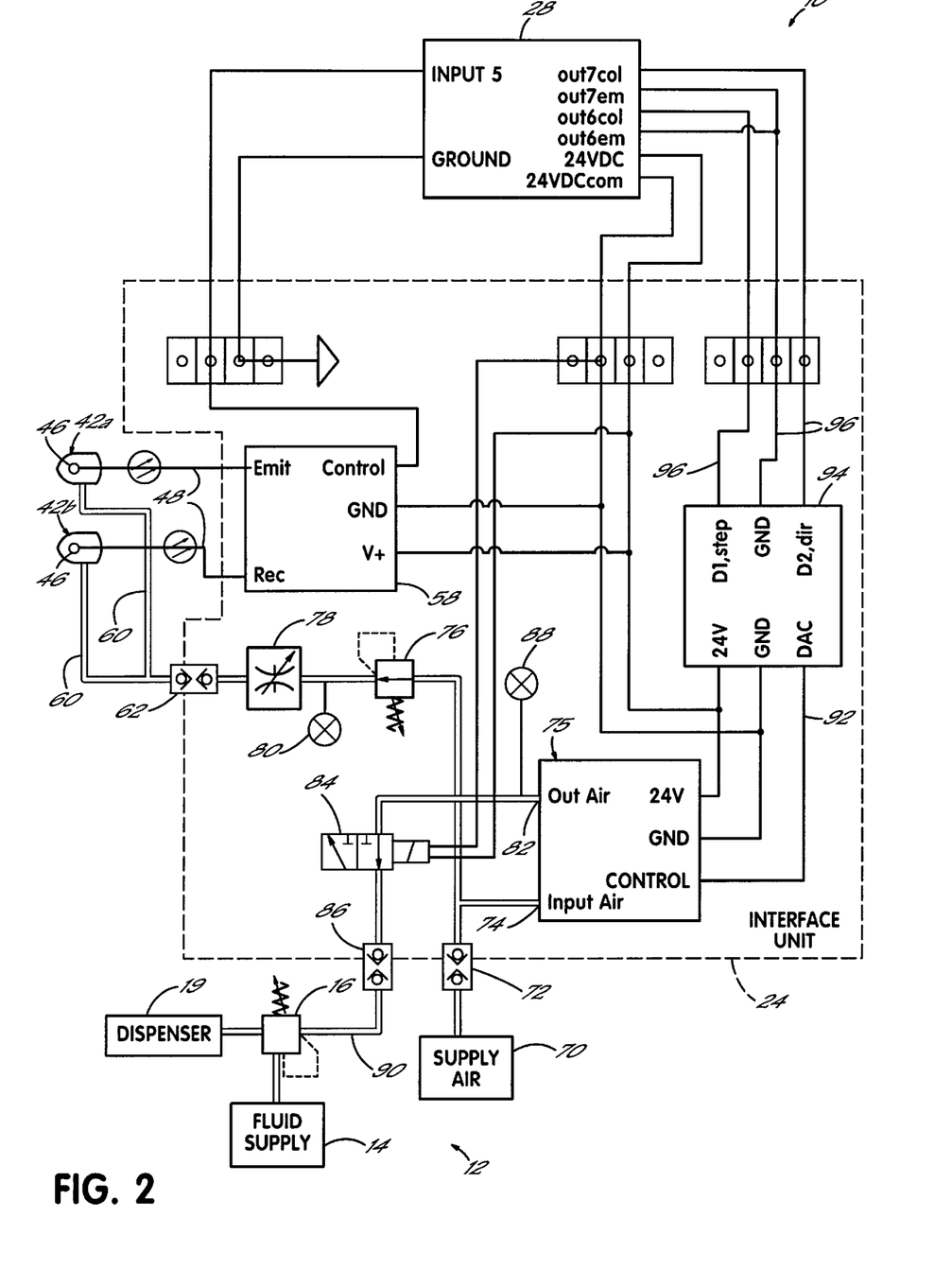
FIG. 2 is a complete block diagram of the liquid spray control system illustrated partially in FIG. 1.
Figure 4:
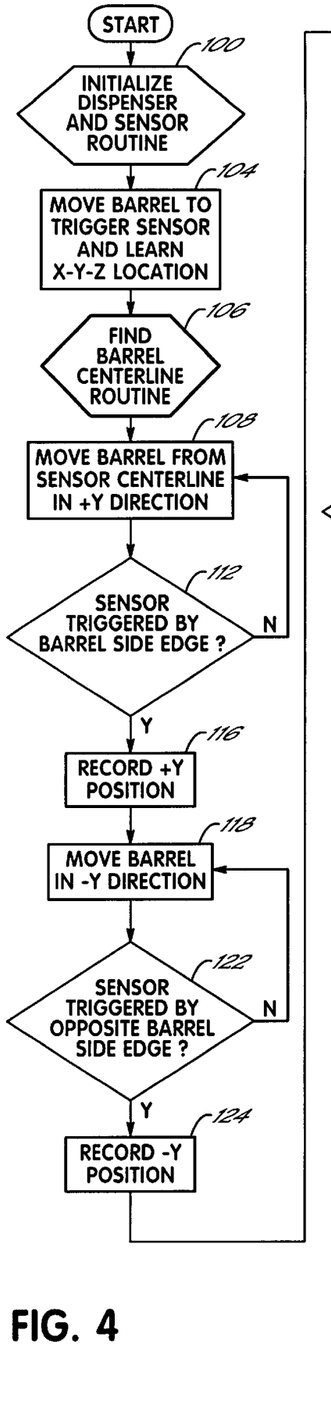
FIG. 4 is a software flow diagram of the "INITIALIZE DISPENSER AND SENSOR ROUTINE" performed by the liquid spray control system of the present invention.

With reference to the figures, and to FIGS. 1 and 2 in particular, a liquid spray control system, indicated generally at 10, is illustrated for use in a liquid spray dispensing system, indicated generally at 12. As described in the exemplary embodiment herein, liquid spray dispensing system 12 includes a supply of liquid material 14 that is fluidly connected to a pneumatically controlled regulator 16. The regulator 16 controls the fluid pressure of liquid material within dispensing barrel and nozzle 18 of dispenser 19 so that the liquid material may be dispensed in a flat, fan-like spray pattern 20 (FIGS. 1 and 8G–8J) onto a substrate (not shown). Liquid dispensing system 12 may be a Nordson Model SC105 or SC205 Select Coat Dispensing System manufactured and sold by Nordson Corporation of Westlake, Ohio. The barrel and nozzle 18 of the liquid dispensing system is moved in X-Y-Z directions relative to the substrate (not shown) under the control of an X-Y-Z robotic movement platform (not shown) to dispense side-by-side, partially overlapping tracks of liquid material onto a surface of the substrate (not shown), such as in a conformal coating process, to provide a uniformly coated moisture proof barrier on the substrate as is well known in the art.

Figure 8A:
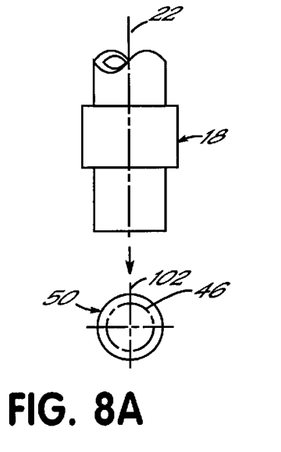
FIGS. 8A–8F are diagrammatic views illustrating movement of a liquid dispenser barrel and nozzle during the "INITIALIZE DISPENSER AND SENSOR ROUTINE" performed by the liquid spray control system of the present invention.

However, as used herein, the term "liquid spray dispensing system" is not limited in any way to liquid dispensing systems for use in a conformal coating process or to liquid dispensing systems that atomize the dispensed liquid. Rather, the term "liquid spray dispensing system" as used herein more broadly refers to any liquid material dispensing system that is operable to dispense liquid material with a predetermined pattern width in a direction toward a substrate. Thus, for example, the liquid spray control system 10 of the present invention may be used with liquid material dispensers that spray paint, adhesives, sealants or fluxes, by way of example, onto a substrate that is positioned in facing relationship to a dispensing nozzle of the dispensing system. The spray pattern dispensed from the liquid dispenser may be atomized or, alternatively, may comprise a continuous band or ribbon of dispensed liquid material, as well as a fibrous web or band of liquid material that emits from a dispensing nozzle with a predetermined pattern width. Moreover, the liquid dispense pattern may be a flat, fan-like pattern as illustrated in the exemplary embodiment described in detail herein or, alternatively, may have an oval, circular, rectangular, square or other cross-section as taken in a plane generally parallel to a plane of the substrate. Thus, as will be described in detail below, the liquid spray control system 10 of the present invention is particularly adapted to measure and adjust the dispensed pattern of liquid material emitting from the nozzle 18, as well as to measure the alignment of the dispensed liquid material pattern relative to a centerline 22 (FIG. 8A) of the dispensing nozzle 18.

Further referring to FIGS. 1 and 2, the liquid spray control system 10 includes an interface unit 24 (FIG. 2) that is electrically and fluidly connected to a sensor fixture 26 (FIG. 1). Interface unit 24 is also fluidly connected to the liquid dispensing system 12 and a source of supply air, and is further electrically coupled to a robot controller 28 (FIG. 2) that is associated with the X-Y-Z robotic movement platform (not shown). More particularly, the sensor fixture 26 includes a drain pan or receptacle 30 made of DELRIN® or similar material that includes a recessed chamber or well 32 for receiving and draining liquid material that is dispensed by the liquid spray dispensing system 12 during the pattern measurement and adjustment procedure as described in detail below. The drain pan 30 has a mounting bracket 34 connected on its lower end that permits the drain pan 30 to be readily mounted through screws (not shown) to a line conveyor (not shown) or other convenient location in the workcell area. The drain pan 30 is connected through Nylon® nipples 36 and tubing 38 to a fluid reservoir 40 that is connected to main system vent air through tubing (not shown).

As shown in FIG. 1, the liquid spray control system 10 includes a fiber optic emitter 42a mounted on one side wall 44 of the drain pan 30, and a fiber optic receiver 42b mounted in confronting relationship on the opposite side wall 44 of the drain pan 30. Suitable fiber optic emitters and receivers are commercially available from Keyence as Part No. FU-77, although other fiber optic emitters and receivers are possible as well. The emitter 42a is operable to emit a beam of light that is received by the receiver 42b as is well known in the art. Each of the fiber optic emitter and receiver 42a and 42b includes a sensor 46 (FIGS. 2 and 3) coupled to a fiber optic cable 48. The sensors 46 are threaded into a generally cylindrical sensor shroud 50 (FIGS. 1 and 3) and secured in place by a locking nut 52. The drain pan 30 includes a pair of upstanding resilient fingers or clips 54 formed in each side wall 44 of the drain pan 30 that are adapted to resiliently engage with an annular recess 56 (FIG. 3) formed on the sensor shroud 50. In this way, the sensor shrouds 50, and their respective sensors 46, may be easily and securely mounted in aligned, confronting relationship on the opposite side walls 44 of the drain pan 30 without tools or adjustment.

Further referring to FIGS. 1–3, the interface unit 24 of the liquid spray control system 10 includes a fiber optic digital amplifier 58 that is coupled to the fiber optic emitter 42a and receiver 42b through the pair of fiber optic cables 48. A suitable fiber optic digital amplifier is commercially available from Keyence as Part No. FS-V1, although other fiber optic digital amplifiers are possible as well. Each of the sensor shrouds 50 is fluidly connected to the interface unit 24 through an air purge tubing 60 that extends from a fluid connection fitting 62 on the interface unit 24 to an air purge fitting 64 (FIG. 3) associated with each sensor shroud 50. The sensor shrouds 50 each receive regulated supply air from the interface unit 24 so that air flows toward the dispensed liquid pattern 20 (FIG. 1) through an annular chamber 66 (FIG. 3) formed about each of the respective sensors 46. In this way, the sensors 46 are kept free from material contamination during use of the liquid spray control system 10 as described in detail below. Cable clips 68 are mounted to each side wall 44 of the drain pan 30 to retain the fiber optic cables 48 and air purge tubing 60 against the drain pan side walls 44 in the vicinity of the sensor fixture 26.

Referring to FIG. 2, the interface unit 24 receives supply air from a supply air source 70 that is fluidly connected through fitting 72 to the interface unit 24. At one location within the interface unit 24, the supply air is fluidly connected to an input 74 of a voltage/pressure regulator 75. A suitable voltage/pressure regulator is commercially available from SMC as Part No. ITV2030-31N2L4, although other voltage/pressure regulators are possible as well. The supply air is also fluidly connected to the fitting 62 associated with air purge tubing 60 through a regulator 76 and an adjustable needle valve 78. The regulator 76 and needle valve 78 permit the purge air pressure supplied to the sensor shrouds 50 to be manually regulated or controlled. A pressure gage 80 is provided on the interface unit 24 between the regulator 76 and the needle valve 78 to provide an operator with a readable value of the purge air pressure supplied to the sensor shrouds 50. As will be described in detail below, the voltage/pressure regulator 75 is operable to provide a regulated air pressure at its output 82 that is fluidly connected to a three-way solenoid valve 84 and a fitting 86 on the interface unit 24. A pressure gage 88 is provided on the interface unit 24 to provide an operator with a readable value of the regulated output air pressure provided by the voltage/pressure regulator 75. The pneumatically controlled fluid regulator 16 of the liquid dispensing system 12 is fluidly coupled to the fitting 86 through tubing 90 to receive the regulated air from the voltage/pressure regulator 75.

As those of ordinary skill in the art will appreciate, the width of the liquid spray pattern 20 dispensed from the nozzle 18 may be readily controlled by varying the air pressure supplied by the voltage/pressure regulator 75 to the pneumatically controlled fluid regulator 16 of the liquid dispensing system 12. The regulated output air pressure supplied by the voltage/pressure regulator 75 is controlled through analog voltage input signal 92 received by regulator 75 from a pressure controller 94 of the interface unit 24. More particularly, the pressure controller 94 is the interface between the robot controller 28 and the voltage/pressure regulator 75. The pressure controller 94 is operable to receive and interpret digital input signals 96 from the robot controller 28 to increase or decrease the regulated output air pressure supplied from the voltage/pressure regulator 75 to the pneumatically controlled fluid regulator 16. The pressure controller 94 converts the digital signals received from the robot controller 28 into the analog signal that is then applied to the voltage/pressure regulator 75. The analog signal, which is proportional to the desired pressure setting, is applied to the voltage/pressure regulator 75 and sets the pressure. A suitable pressure controller is commercially available from Z-World as Part No. 101-0267, although other pressure controllers are possible as well.

Operation of the liquid spray control system 10, including sensor fixture 26, robot controller 28 and interface unit 24, and liquid dispensing system 12 will now be described in connection with measurement and adjustment of the dispensed liquid spray pattern 20 (FIG. 1) in accordance with the principles of the present invention. In one embodiment of the present invention, the robot controller 28 is operable to run the software routines of FIGS. 4–7 or alternatively FIG. 9 to perform three functions: 1) automatically adjust the width of the dispensed liquid spray pattern to an operator selected value; 2) automatically measure the width of the liquid spray pattern, compare that value to a predefined acceptable pattern width range set by the operator, and provide a warning to the operator if that value falls outside the acceptable range; and 3) automatically measure the offset of the liquid spray pattern relative to the centerline (FIG. 8A) of the barrel and nozzle 18, compare that value to a predefined acceptable pattern offset range set by the operator, and provide a warning to the operator if that value falls outside the acceptable range. Those skilled in the art will appreciate that the software may reside in memory (RAM/ROM) and/or on tape, disc or diskette associated with the robot controller, although the location of the software is not limited to the robot controller 28 as will be appreciated by those of ordinary skill in the art.

Figure 8B:
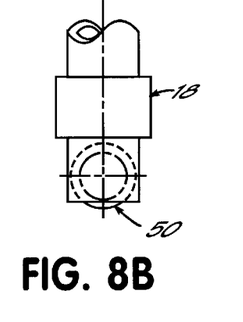

Referring now to FIGS. 4 and 8A–8F, the "INITIALIZE DISPENSER AND SENSOR ROUTINE" 100 will now be described. The purpose of this routine is primarily to positionally associate the centerline 22 (FIG. 8A) of barrel and nozzle 18 with the vertical centerline 102 (FIG. 8A) of the sensors 46. At step 104, the operator moves the barrel and nozzle 18 in X-Y-Z directions through keyboard (not shown) or keypad (not shown) instructions to trigger the sensors 46 (i.e. fiber optic receiver 42b) as shown in FIG. 8B. As used herein, "triggering" refers to a state of the sensors 46 in which either the light beam transitions from a state of being absent to the fiber optic receiver 42b to a state of being present to the fiber optic receiver 42b, or the light beam transitions from a state of being present to the fiber optic receiver 42b to a state of being absent to the fiber optic receiver 42b. Each of these transitions will cause one of the sensors 46 (fiber optic receiver 42b) to "trigger" and couple a signal to the digital fiber optic amplifier 58. The light beam sensitivity of the sensors 46 is adjustable at the digital fiber optic amplifier 58. When a sensor 46 is "triggered," indicating that the barrel and nozzle 18 is positioned between the sensors 46 as shown in FIG. 8B, the X-Y-Z location of the barrel and nozzle 18 is learned and stored.

Figure 8C:
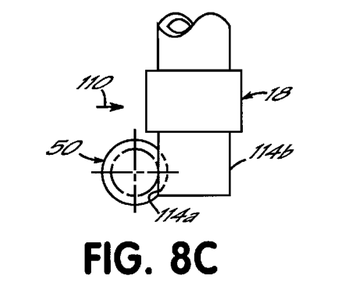

Once the barrel 18 has been located by the sensors 46, the "FIND BARREL CENTERLINE ROUTINE" 106 is executed. The purpose of this routine is to positionally locate the centerline 22 of barrel and nozzle 18. At step 108, the barrel 18 is moved from the sensor centerline 102 in a +Y direction as shown in FIG. 8C and indicated by arrow 110. At step 112, a determination is made whether a sensor 46 was triggered by a side edge 114a of the barrel 18. If a sensor 46 is not triggered, control passes back to step 108 and the barrel 18 continues to move in the +Y direction from the sensor centerline 102. If, on the other hand, the sensor 46 is triggered by the barrel side edge 114a as shown in FIG. 8C, the +Y position of the sensed barrel edge 114a is recorded at step 116.

Figure 8D:
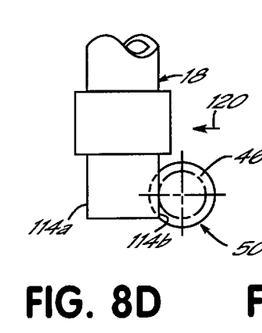
Figure 8E:
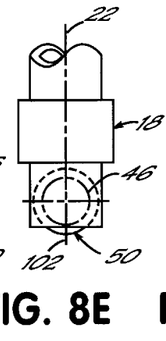
Figures 8F, 8G:
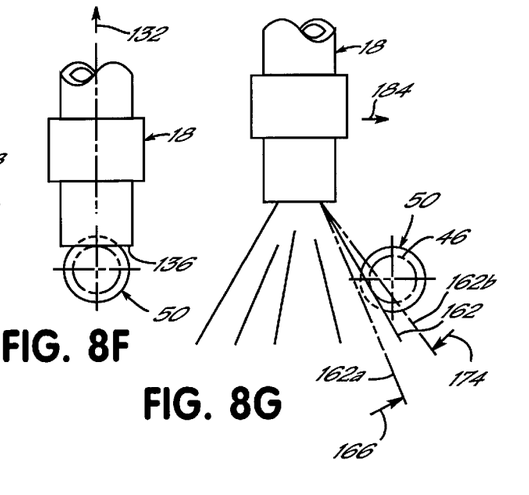
FIG. 8G is a diagrammatic view illustrating movement of the liquid dispenser barrel and nozzle during the "FAN WIDTH CALIBRATION ROUTINE" performed by the liquid spray control system of the present invention.

Thereafter, at step 118, the barrel 18 is moved in the -Y direction as shown in FIG. 8D and indicated by arrow 120. At step 122, a determination is made whether a sensor 46 was triggered by the opposite barrel side edge 114b. If a sensor 46 was not triggered, control passes back to step 118 and the barrel 18 continues to move in the -Y direction. If a sensor 46 is triggered, the -Y position of the opposite barrel side edge 114b is recorded at step 124. From the recorded +Y and -Y positions, the location of the barrel centerline 22 is calculated at step 126 as one-half the sum of the +Y and -Y values. Thereafter, at step 128, the barrel 18 is moved so that barrel centerline 22 coincides with the sensor centerline 102 as shown in FIG. 8E. Next, at step 130, the barrel 18 is moved in the +Z direction as shown in FIG. 8F and indicated by arrow 132. At step 134, a determination is made whether a sensor 46 has been triggered by barrel end 136. If a sensor 46 has not been triggered by the barrel end 136, control passes back to step 130 and the barrel 18 continues to move in the +Z direction. If a sensor 46 is triggered by the barrel end 136, the +Z position of the barrel end 136 is recorded at step 138. At step 140, the desired air pressure value for the fluid regulator 16 is received from the operator or a preset air pressure is used. Lastly, at step 142, the "INITIALIZE DISPENSER AND SENSOR ROUTINE" is complete and control passes over to the "PATTERN SETTING. ROUTINE" 144 of FIG. 5.

Figure 5:
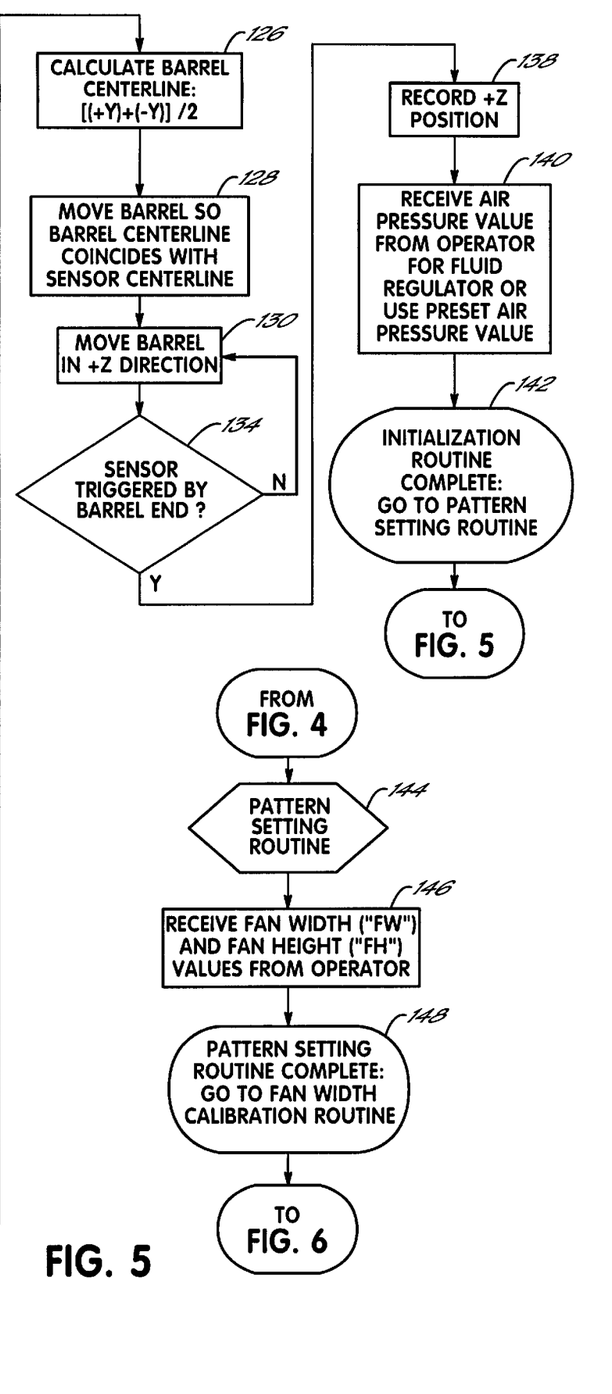
FIG. 5 is a software flow diagram of the "PATTERN SETTING ROUTINE" performed by the liquid spray control system of the present invention.

The purpose of the "PATTERN SETTING ROUTINE" 144 is to set the desired fan width ("FW") and fan height ("FH") desired by the operator. To this end, as shown in FIG. 5, at step 146, of the "PATTERN SETTING ROUTINE" 144, the fan width ("FW") and the fan height ("FH") values are received from the operator. At step 148, the "PATTERN SETTING ROUTINE" 144 is complete and control passes over to the "FAN WIDTH CALIBRATION ROUTINE" 150 shown in FIG. 6.

Figure 6:
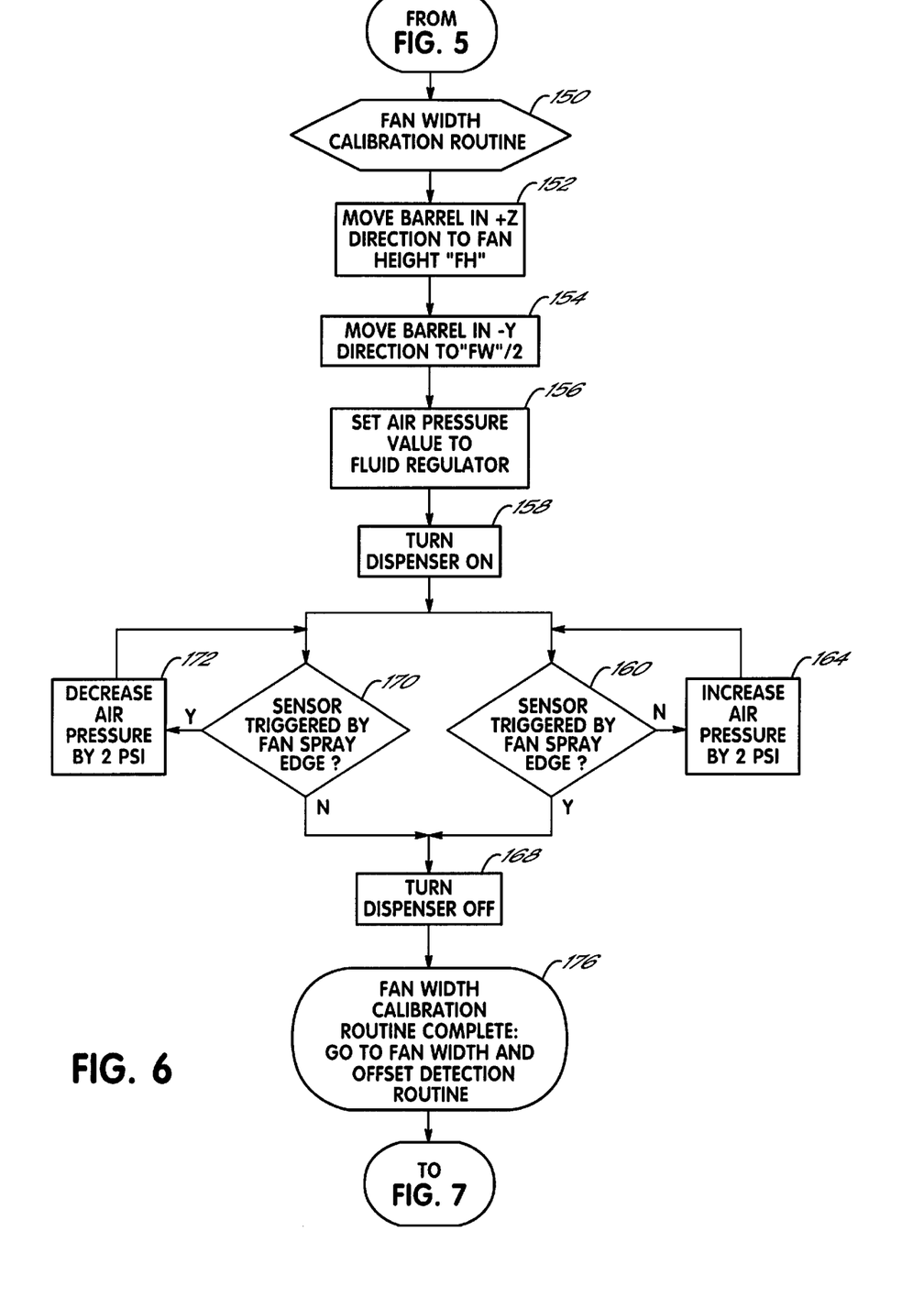
FIG. 6 is a software flow diagram of the "FAN WIDTH CALIBRATION ROUTINE" performed by the liquid spray control system of the present invention.

The purpose of the "FAN WIDTH CALIBRATION ROUTINE" 150 is to automatically adjust the actual width of the fan to the programmed fan width ("FW") value. Referring to FIG. 6, at step 152, the barrel 18 is moved in the +Z direction to fan height ("FH") as shown in FIG. 8G. At step 154, the barrel 18 is moved in the -Y direction to a -Y position corresponding to "FW"/2 as shown in FIG. 8G. At step 156, the air pressure value to the fluid regulator 16 is set with either the operator selected value or the preset air pressure value. Next, at step 158, the dispenser 19 is turned on. At one step 160, a determination is made whether a sensor 46 has been triggered by a fan spray edge 162. If a sensor 46 is not triggered by the fan spray edge 162, indicating that an edge 162a is not positioned between the sensors 46, control passes to step 164 that increases the air pressure supplied to fluid regulator 16 in 2 PSI increments to increase the fan width ("FW") as indicated by arrow 166. Of course, other increments are possible without departing from the spirit and scope of the present invention. The increase in air pressure of fluid regulator 16 results from electrical signals being coupled from the amplifier 58 to robot controller 28 which provides digital input signals 96 to the pressure controller 94. The pressure controller 94 converts the digital input signals 96 to the analog signal 92 that is applied to the voltage/pressure regulator 75 as described in detail above. At step 160, a determination is made whether a sensor 46 was triggered by fan spray edge 162, thereby indicating that a properly adjusted fan width ("FW") has been set. If yes, the dispenser 19 is turned off at step 168.

Figure 7:
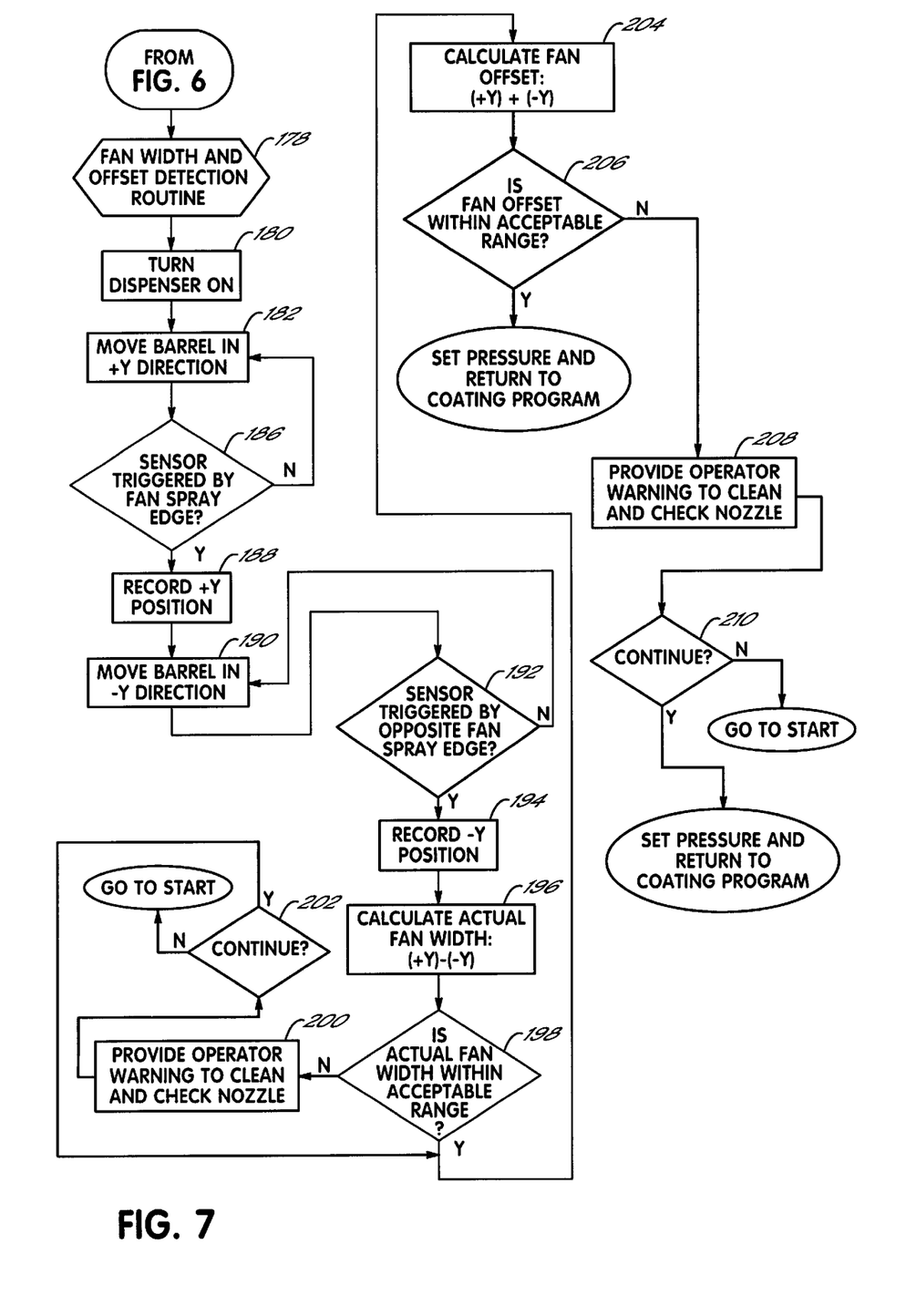
FIG. 7 a software flow diagram of the "FAN WIDTH AND OFFSET DETECTION ROUTINE" performed by the liquid spray control system of the present invention.

At step 170, a determination is made whether a sensor 46 was triggered by a fan spray edge 162 when the dispenser 19 was turned on. If a sensor 46 is triggered by the fan spray edge 162, such as would be caused by fan edge 162b in FIG. 8G, the air pressure supplied to pressure regulator 16 is decreased at step 172 in 2 PSI increments to cause the fan edge 162b to narrow as indicated by arrow 174. Once the proper edge position of the fan edge 162 is adjusted and set, the dispenser 19 is turned off at step 168 and the "FAN WIDTH CALIBRATION ROUTINE" 150 is complete at step 176 and control is then passed to the "FAN WIDTH AND OFFSET DETECTION ROUTINE" 178 as shown in FIG. 7.

The purpose of the "FAN WIDTH AND OFFSET DETECTION ROUTINE" 178 is to automatically measure the actual fan width ("FW") and offset of the fan pattern relative to the barrel centerline 22. As shown in FIG. 7, at step 180, the dispenser 19 is turned on. Next, at step 182, the barrel 18 is moved in the +Y direction as indicated by the arrow 184 in FIG. 8G. At step 186, a determination is made whether a sensor 46 was triggered by a fan spray edge 162. If the sensor 46 is not triggered, control passes back to step 182 and the barrel 18 continues to move in the +Y direction. If the sensor 46 is triggered by the fan spray edge 162, as occurs in FIG. 8H, the +Y position of the barrel 18 is recorded at step 188. Then, at step 190, the barrel 18 is moved in the −Y direction as indicated by arrow 191 in FIG. 8H. At step 192, a determination is made whether a sensor 46 was triggered by the opposite fan spray edge 162. If a sensor 46 is not triggered by the fan spray edge 162, control passes back to step 190 and the barrel 18 continues to move in the −Y direction. If, however, a sensor 46 is triggered by the opposite fan spray edge 162 as occurs in FIG. 8I, the −Y position of the barrel 18 is recorded at step 194. At step 196, the actual fan width is calculated as the difference of the stored +Y and −Y values.

At step 198, a determination is made whether the measured fan width falls within an acceptable range. If the actual fan width is not within an acceptable range, control passes to step 200 and a warning is provided to the operator to clean and check the nozzle. At step 202, a determination is made whether the operator wants to continue. If not, control passes back to "START."

Otherwise, if the actual fan width is within an acceptable range, or the operator has elected to continue, control passes to step 204 and the fan offset is calculated relative to the centerline 22 of the barrel 18 as the sum of the stored +Y and −Y values. At step 206, a determination is made to whether the fan offset falls within an acceptable range. If not, control passes to step 208 and a warning is given to the operator to clean and check the nozzle. Thereafter, a determination is made whether the operator wants to continue at step 210. If not, control passes back to "START." Otherwise, the pressure is set and control is returned to the coating program. If a determination is made at step 206 that the fan offset is within an acceptable range, the pressure is set and control is also passed to the coating program.

Figure 9:
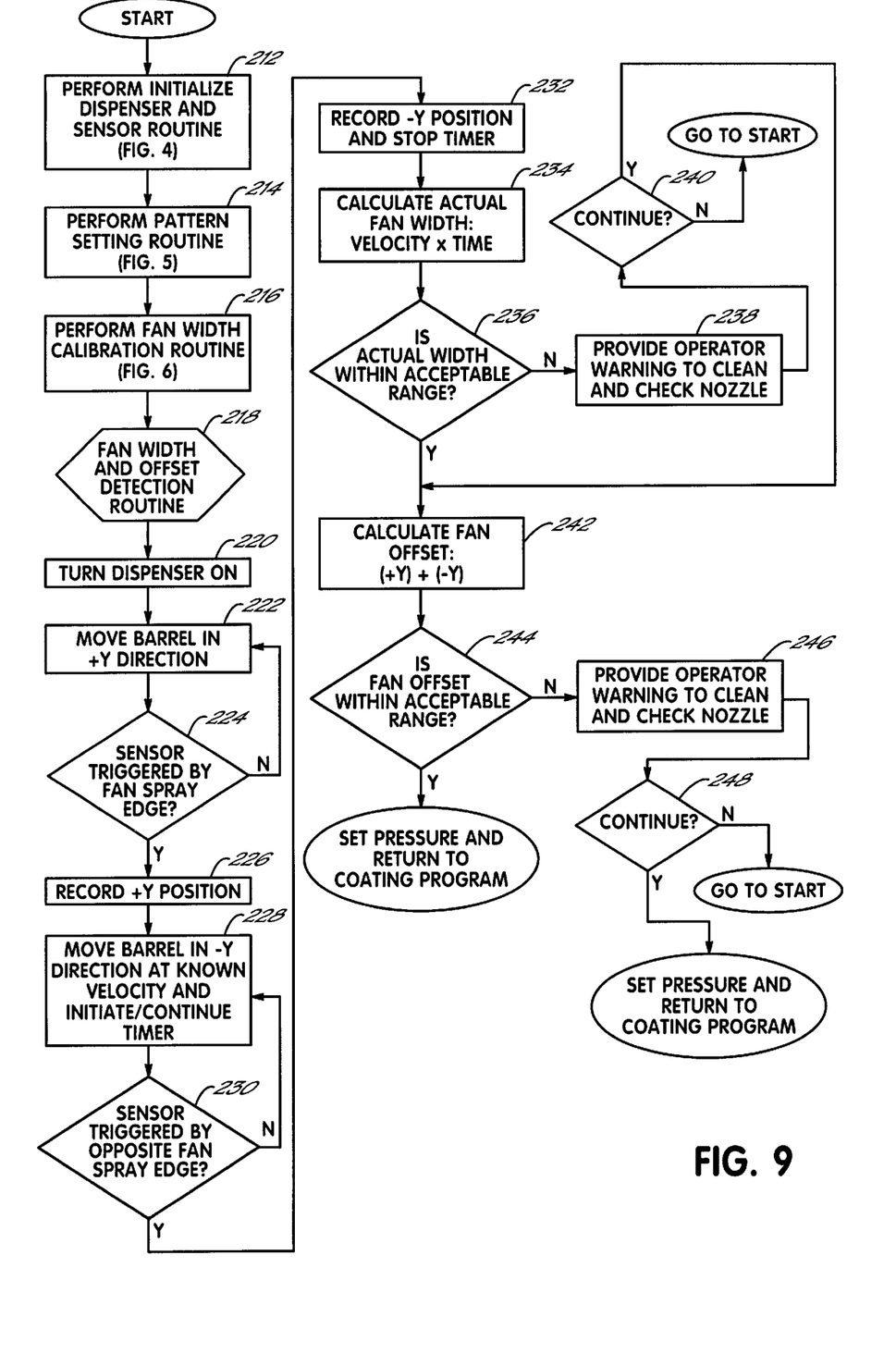
FIG. 9 is a software flow diagram of an alternative liquid spray control program performed by the liquid spray control system of the present invention.

As shown in FIG. 9, an alternative software program is shown for execution by the liquid spray control system 10. At step 212, the "INITIALIZE DISPENSER AND SENOR ROUTINE" is performed as described in detail above in relation to FIG. 4. Next, at step 214, the "PATTERN SETTING ROUTINE" is performed as described in detail above in relation to FIG. 5. At step 216, the "FAN WIDTH CALIBRATION ROUTINE" is performed as described in detail above in relation to FIG. 6. Thereafter, control passes at step 218 to "FAN WIDTH AND OFFSET DETECTION ROUTINE" in accordance with the alternative embodiment of the present invention. At step 220, the dispenser 19 is turned on. Barrel 18 is then moved in the +Y direction at step 222 as shown in FIG. 8G and represented by arrow 184.

Figure 8H:
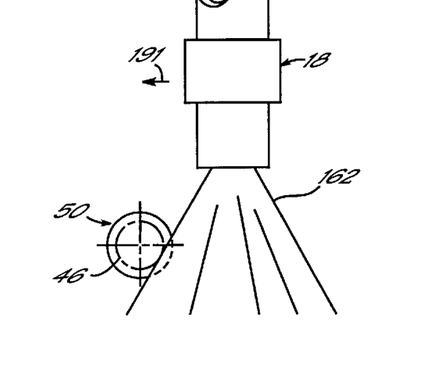
FIGS. 8H and 8I are diagrammatic views illustrating movement of the liquid dispenser barrel and nozzle during the "FAN WIDTH AND OFFSET DETECTION ROUTINE" performed by the liquid spray control system of the present invention.

At step 224, a determination is made whether a sensor 46 was triggered by a fan spray edge 162. If not, control passes back to step 222 and the barrel 18 continues to move in the +Y direction. If a sensor 46 was triggered by a fan spray edge 162, at step 226, the +Y position of barrel 18 is recorded as shown in FIG. 8H. Next, at step 228, the barrel 18 is moved in the −Y direction at a known constant velocity and a timer (not shown) is initiated. At step 230, a determination is made whether a sensor 46 was triggered by the opposite fan spray edge 162. If not, control passes back to step 228 and the barrel 18 continues to move in the −Y direction at the known constant velocity. If a sensor 46 was triggered by opposite fan spray edge 162, as occurs in FIG. 8I, control then passes to step 232 and the −Y position of the barrel 18 is recorded and the timer is stopped. At step 234, the actual fan width is calculated as the product of the known velocity and the elapsed time established by the timer.

At step 236, a determination is made whether the actual fan width falls within an acceptable range. If not, at step 238 a warning is given to the operator to clean and check nozzle. At step 240 a determination is made whether the operator wants to continue. If not, control passes back to "START." Otherwise, if the operator elects to continue or the actual fan width falls within an acceptable range, control passes to step 242 and the offset of the fan pattern relative to the centerline 22 of barrel 18 is calculated as the sum of the stored +Y and −Y position values.

At step 244, a determination is made whether the fan offset falls within an acceptable range. If not, a warning is given to the operator at step 246 to clean and check the nozzle. At step 248, a determination is made whether the operator wants to continue. If not, control is passed back to "START." Otherwise, the pressure is set and control is passed back to the coating program. If the fan offset does fall within an acceptable range, the pressure is also set and control passes back to the coating program. Of course, those of ordinary skill in the art will readily appreciate the hardware and software modifications that can be made to the liquid spray control system 10. Thus, hardware and software changes may be made to liquid spray control system 10 without departing from the spirit and scope of the present invention. For example, while fiber optic sensors are described, those skilled in the art will appreciate the multitude of sensor devices that could be substituted in the present invention. Moreover, while in one embodiment of the present invention the liquid dispenser system 12 is responsive to air pressure supplied by the voltage/pressure regulator 75, those skilled in the art will readily appreciate the multitude of other regulator devices that could be substituted in the present invention for controlling the fluid pressure within the liquid dispensing system 12.

In view of the foregoing, it will be readily understood by those of ordinary skill in the art, that the liquid spray control system 10 of the present invention automatically performs the function of adjusting the width of the spray pattern 20 to the value set by the operator. For example, if the fan width is initially too narrow, the liquid spray control system 10 incrementally increases the air pressure supplied to the fluid regulator 16 to widen the fan width as indicated by arrow 166 in FIG. 8G. On the other hand, if the fan width is initially too wide, the liquid spray control system 10 automatically decreases the fan width to the preset value by incrementally decreasing the air pressure supplied to the fluid regulator 16 to thereby narrow the fan width as indicated by arrow 174 in FIG. 8G. Moreover, the liquid spray control system 10 automatically measures the actual fan width and determines whether the actual fan width falls within an acceptable range. In this way, if the actual fan width falls outside of the acceptable range, the operator is automatically given a warning and a decision on whether to continue. Thus, a wasteful coating production run is avoided. Additionally, the liquid spray control system 10 automatically measures the offset of the fan pattern relative to the centerline 22 of the barrel 18. If the measured offset is outside an acceptable, the operator is also given a warning and a decision on whether to continue with the coating process. Thus, the liquid spray control system 10 of the present invention improves width control of a dispensed liquid pattern. The liquid spray control system 10 also improves the operator's ability to readily identify problems in the dispensed liquid spray pattern. Moreover, the liquid spray control system 10 of the present invention improves the operator's ability to adjust the width of the liquid spray pattern to accommodate for variations on liquid material viscosities and pressures.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. For example, while the barrel and nozzle 18 has been described in detail as moving relative to the sensor fixture 22, it will be appreciated that, alternatively the barrel and nozzle 18 may be fixed and the sensor fixture 22 is adapted to move in X-Y-Z directions to perform the measurement and adjustment of the dispensed liquid spray pattern. The invention in its broader aspects is therefore not limited to the specific details, representative apparatus and method, and illustrative example shown and described. Accordingly, departures may be made from such details without departing from the spirit or scope of applicants' general inventive concept.

Having described the invention, we claim:

1. A method of measuring the width of a liquid spray pattern having a first and second edge using a liquid dispenser having a centerline, a first edge and a second opposite edge and a sensor, comprising:

dispensing the liquid spray pattern from the liquid dispenser;

moving the liquid spray pattern in one direction relative to the sensor;

detecting the first edge of the liquid spray pattern with the sensor;

associating the detected liquid spray pattern first edge with a first position;

moving the liquid spray pattern in an opposite direction relative to the sensor;

detecting the second edge of the liquid spray pattern with the sensor;

associating the detected liquid spray pattern second edge with a second position; and calculating the width of the liquid spray pattern using the first and second positions.

2. The method of claim 1 further comprising the steps of:

determining a position of the sensor;

determining a position of the dispenser centerline;

associating the position of the dispenser centerline with the position the sensor; and calculating an offset of the liquid spray pattern relative to the dispenser centerline using the first and second positions.

3. The method of claim 2 wherein the step of determining the position of the dispenser centerline comprises:

moving the dispenser in one direction relative to the sensor;

detecting the first edge of the dispenser with the sensor;

associating the detected dispenser first edge with a third position;

moving the dispenser in an opposite direction relative to the sensor;

detecting the second opposite edge of the dispenser with the sensor;

associating the detected dispenser second opposite edge with a fourth position; and calculating the position of the dispenser centerline using the third and fourth positions.

4. The method of claim 1 wherein the step of detecting the first edge of the liquid spray pattern comprises:

transmitting a beam of light;

moving the liquid spray pattern through the beam of light; and generating a signal in response to one of the presence or absence of the liquid spray pattern first edge within the beam of light.

5. The method of claim 4 wherein the step of detecting the second edge of the liquid spray pattern comprises:

continuing to move the liquid spray pattern through the beam of light; and generating a signal in response to one of the presence or absence of the liquid spray pattern second edge within the beam of light.

6. A method of measuring the width of a liquid spray pattern having a first and second edge using a liquid dispenser having a centerline, a first edge and a second opposite edge, a sensor and a timer, comprising:

dispensing the liquid spray pattern from the liquid dispenser;

moving the liquid spray pattern in one direction relative to the sensor;

detecting the first edge of the liquid spray pattern with the sensor;

initiating the timer upon detecting the first edge of the liquid spray pattern;

moving the liquid spray pattern at a constant velocity in an opposite direction relative to the sensor;

detecting the second edge of the liquid spray pattern with the sensor;

terminating the timer upon detecting the second edge of the liquid spray pattern;

determining the elapsed time between said initiation of the timer and said termination of the timer; and calculating a width of the liquid spray pattern using the elapsed time and the constant velocity.

7. The method of claim 6 further comprising the steps of:

associating the detected liquid spray pattern first edge with a first position;

associating the detected liquid spray pattern second edge with a second position;

determining a position of the sensor;

determining a position of the dispenser centerline;

associating the position of the dispenser centerline with the position of the sensor; and calculating an offset of the liquid spray pattern relative to the dispenser centerline using the first and second positions.

8. The method of claim 7 wherein the step of determining the position of the dispenser centerline comprises:

moving the dispenser in one direction relative to the sensor;

detecting the first edge of the dispenser with the sensor;

associating the detected dispenser first edge with a third position;

moving the dispenser in an opposite direction relative to the sensor;

detecting the second opposite edge of the dispenser with the sensor;

associating the detected dispenser second opposite edge with a fourth position; and calculating the position of the dispenser centerline using the third and fourth positions.

9. The method of claim 8 wherein the step of detecting the first edge of the liquid spray pattern comprises:

transmitting a beam of light;

moving the liquid spray pattern through the beam of light; and generating a signal in response to one of the presence or absence of the liquid spray pattern first edge within the beam of light.

10. The method of claim 9 wherein the step of detecting the second edge of the liquid spray pattern comprises:

continuing to move the liquid spray pattern through the beam of light; and generating a signal in response to one of the presence or absence of the liquid spray pattern second edge within the beam of light.

11. A method of adjusting the width of a liquid spray pattern using a liquid dispenser and a sensor, comprising:

positioning the liquid dispenser at a predetermined position relative to the sensor;

dispensing the liquid spray pattern from the liquid dispenser at a predetermined dispensing pressure;

detecting an absence of the liquid spray pattern with the sensor;

increasing the width of the liquid spray pattern by increasing the dispensing pressure until the liquid spray pattern is detected by the sensor.

12. A method of adjusting the width of a liquid spray pattern using a liquid dispenser and a sensor, comprising:

positioning the liquid dispenser at a predetermined position relative to the sensor;

dispensing the liquid spray pattern from the liquid dispenser at a predetermined dispensing pressure;

detecting a presence of the liquid spray pattern with the sensor;

decreasing the width of the liquid spray pattern by decreasing the dispensing pressure until an absence of the liquid spray pattern is detected by the sensor.

13. A liquid dispensing system for dispensing a variable width liquid spray pattern having a first and second edge, comprising:

a source of liquid material;

a dispensing nozzle connected to said source of liquid material and capable of dispensing said liquid material as a liquid spray pattern with a predetermined spray pattern width;

a pneumatically controlled pressure regulator operatively coupled to said source of liquid material and said dispensing nozzle to regulate a pressure at which said liquid material is dispensed by said dispensing nozzle; and a control circuit coupled to said pressure regulator and capable of varying the regulated pressure at which said liquid material is dispensed by said dispensing nozzle to increase or decrease the width of the liquid spray pattern.

14. The liquid dispensing system of claim 13 further comprising a source of air operatively connected to said control circuit, wherein said pressure regulator comprises a pneumatically controlled fluid regulator having an air inlet coupled to said source of air and capable of increasing or decreasing the pressure at which said liquid material is dispensed by said dispensing nozzle by varying a pressure of air at said air inlet.

15. The liquid dispensing system of claim 14 wherein said control circuit is capable of varying the pressure of air at said air inlet of said pneumatically controlled fluid regulator to increase or decrease the pressure at which said liquid material is dispensed by said dispensing nozzle.

16. The liquid dispensing system of claim 14 further comprising a sensor coupled to said control circuit and capable of detecting one of the presence or absence of the first edge and second edge of the liquid spray pattern.

17. The liquid dispensing system of claim 16 wherein said sensor is capable of applying a signal to said control circuit in response to detecting one of the presence or absence of at least one of the first edge and second edge, and further wherein said control circuit is capable of varying the regulated pressure at which said liquid material is dispensed by said dispensing nozzle in response to receipt of said signal to increase or decrease the width of the liquid spray pattern.

18. The liquid dispensing system of claim 17 wherein said sensor comprises a light beam emitter and a light beam receiver.

19. The liquid dispensing system of claim 16 further comprising a fluid receptacle defined by a bottom wall, a pair of upstanding side walls and a pair of upstanding end walls and capable of receiving said liquid material dispensed from said dispensing nozzle, each of said side walls having a pair of resilient retaining members capable of releasably engaging therebetween said sensor.

20. The liquid dispensing system of claim 19 wherein each of said pair of resilient retaining members are formed in each of said fluid receptacle side walls.

21. The liquid dispensing system of claim 16 further comprising a shroud member mounted about said sensor to form an annular chamber thereabout, said shroud member having an air inlet connected to said annular chamber and to said source of air and being capable of emitting air toward the liquid spray pattern.

* * * * *

UNITED STATES PATENT AND TRADEMARK OFFICE
CERTIFICATE OF CORRECTION

PATENT NO.     : 6,457,655 B1
DATED          : October 1, 2002
INVENTOR(S)    : Reighard et al.

It is certified that error appears in the above-identified patent and that said Letters Patent is hereby corrected as shown below:

<u>Title page,</u>
Item [57], ABSTRACT,
Line 3, change "includes a sensor that detect edges of" to -- includes a sensor that detects edges of --.

<u>Column 3,</u>
Line 60, change "FIG. 7 a software" to -- FIG. 7 is a software --.

Figure 8I:
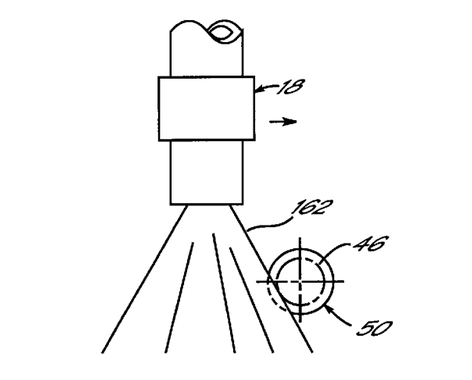

<u>Column 9,</u>
Line 7, change "as occurs in FIG. 81," to -- as occurs in FIG. 8I, --.
Line 22, change "a determination is made to whether the" to -- a determination is made as to whether the --.
Line 59, change "as occurs in FIG. 81," to -- as occurs in FIG. 8I, --.
Line 66, change "to clean and check nozzle" to -- to clean and check the nozzle --.

<u>Column 10,</u>
Line 54, change "is outside an acceptable, the operator is also given" to
-- is outside an acceptable range, the operator is also given --.

<u>Column 11,</u>
Line 42, change "with the position the sensor; and" to -- with the position of the sensor; and --.

Signed and Sealed this

Eighth Day of April, 2003

JAMES E. ROGAN
*Director of the United States Patent and Trademark Office*